United States Patent
Ding et al.

(10) Patent No.: US 10,452,175 B2
(45) Date of Patent: Oct. 22, 2019

(54) OLED DISPLAY SUBSTRATE, DRIVING METHOD THEREOF, AND OLED DISPLAY DEVICE

(71) Applicants: BOE Technology Group Co., Ltd., Beijing (CN); Beijing BOE Optoelectronics Technology Co., Ltd., Beijing (CN)

(72) Inventors: Xiaoliang Ding, Beijing (CN); Xue Dong, Beijing (CN); Haisheng Wang, Beijing (CN); Xiaochuan Chen, Beijing (CN); Yingming Liu, Beijing (CN); Tao Ren, Beijing (CN); Wei Liu, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 145 days.

(21) Appl. No.: 15/505,787
(22) PCT Filed: Feb. 18, 2016
(86) PCT No.: PCT/CN2016/073984
§ 371 (c)(1),
(2) Date: Feb. 22, 2017
(87) PCT Pub. No.: WO2017/049854
PCT Pub. Date: Mar. 30, 2017

(65) Prior Publication Data
US 2017/0300154 A1   Oct. 19, 2017

(30) Foreign Application Priority Data
Sep. 22, 2015 (CN) .......................... 2015 1 0608312

(51) Int. Cl.
*G06F 3/041* (2006.01)
*G09G 3/3233* (2016.01)
(Continued)

(52) U.S. Cl.
CPC ............ *G06F 3/0412* (2013.01); *G06F 3/044* (2013.01); *G06F 3/0416* (2013.01);
(Continued)

(58) Field of Classification Search
CPC ............. G09G 3/3233; G09G 2310/08; G09G 2300/0819; G09G 2300/0842;
(Continued)

(56) References Cited

U.S. PATENT DOCUMENTS

2007/0085844 A1* 4/2007 Kasuya ................ G09G 3/3208
345/204
2012/0249454 A1 10/2012 Teraguchi et al.
(Continued)

FOREIGN PATENT DOCUMENTS

CN 101894856 A 11/2010
CN 102338945 A 2/2012
(Continued)

OTHER PUBLICATIONS

Jun. 20, 2016—(WO) International Search Report and Written Opinion Appn PCT/CN2016/073984 with English Tran.
(Continued)

*Primary Examiner* — Ariel A Balaoing
(74) *Attorney, Agent, or Firm* — Banner & Witcoff, Ltd.

(57) ABSTRACT

An OLED display substrate, a driving method thereof and an OLED display device. The OLED display substrate includes: a base substrate and a first electrode layer, a light-emitting layer and a second electrode layer disposed on the base substrate, the light-emitting layer being disposed between the first electrode layer and the second electrode layer, the first electrode layer including a driving electrode and a sensing electrode corresponding to the driving electrode, and a mutual capacitance being formed between the driving electrode and the sensing electrode corresponding to
(Continued)

the driving electrode. A mutual capacitance is formed between the driving electrode and the sensing electrode corresponding to the driving electrode, so as to integrate a touch technology and an OLED display technology.

16 Claims, 4 Drawing Sheets

(51) Int. Cl.
*G06F 3/044* (2006.01)
*H01L 27/32* (2006.01)
*H01L 51/52* (2006.01)

(52) U.S. Cl.
CPC ......... *G09G 3/3233* (2013.01); *H01L 27/323* (2013.01); *H01L 51/5209* (2013.01); *H01L 51/5225* (2013.01); *G09G 2300/0819* (2013.01); *G09G 2300/0842* (2013.01); *G09G 2300/0861* (2013.01); *G09G 2310/0245* (2013.01); *G09G 2310/08* (2013.01)

(58) Field of Classification Search
CPC .... G09G 2300/0861; G09G 2310/0245; G06F 3/0412; G06F 3/0416; G06F 3/044; H01L 27/323; H01L 51/5209; H01L 51/5225
See application file for complete search history.

(56) References Cited

U.S. PATENT DOCUMENTS

| | | | | |
|---|---|---|---|---|
| 2012/0274603 A1* | 11/2012 | Kim | .................... | G06F 3/0412 345/174 |
| 2013/0194248 A1* | 8/2013 | Kim | .................... | G09G 3/3233 345/212 |
| 2013/0293499 A1* | 11/2013 | Chang | .................... | G06F 3/041 345/173 |
| 2014/0022186 A1* | 1/2014 | Hong | .................... | G06F 3/0416 345/173 |
| 2014/0168154 A1* | 6/2014 | Wang | .................... | G06F 3/0412 345/174 |
| 2014/0192027 A1* | 7/2014 | Ksondzyk | .............. | G01N 27/22 345/178 |
| 2015/0170575 A1 | 6/2015 | Kwak et al. | | |
| 2017/0031520 A1* | 2/2017 | Kang | .................... | G06F 3/0418 |

FOREIGN PATENT DOCUMENTS

| | | | |
|---|---|---|---|
| CN | 102541334 | A | 7/2012 |
| CN | 102693703 | A | 9/2012 |
| CN | 103186308 | A | 7/2013 |
| CN | 103294273 | A | 9/2013 |
| CN | 103928492 | A | 7/2014 |
| CN | 103928493 | A | 7/2014 |
| CN | 103943061 | A | 7/2014 |
| CN | 104049801 | A | 9/2014 |
| CN | 104076966 | A | 10/2014 |
| CN | 104571769 | A | 4/2015 |
| CN | 104793804 | A | 7/2015 |
| CN | 104835454 | A | 8/2015 |
| CN | 104850268 | A | 8/2015 |
| CN | 104898887 | A | 9/2015 |
| CN | 105243993 | A | 1/2016 |

OTHER PUBLICATIONS

Sep. 5, 2017—(CN) Second Office Action Appn No. 201510608312.5 with English Tran.
May 8, 2017—(CN) First Office Action Appn 201510608312.5 with English Tran.

\* cited by examiner

OLED light-emitting device

OLED DISPLAY SUBSTRATE, DRIVING METHOD THEREOF, AND OLED DISPLAY DEVICE

The application is a U.S. National Phase Entry of International Application No. PCT/CN2016/073984 filed on Feb. 18, 2016, designating the United States of America and claiming priority to Chinese Patent Application No. 201510608312.5 filed on Sep. 22, 2015. The present application claims priority to and the benefit of the above-identified applications and the above-identified applications are incorporated by reference herein in their entirety.

TECHNICAL FIELD

The present disclosure relates to a technical field of display, and more particularly, to an OLED display substrate, a driving method thereof, and an OLED display device.

BACKGROUND

Organic Light-emitting Devices (OLEDs) typically adopt a structure of a sandwich-type, i.e., an organic layer being sandwiched between a cathode and an anode on both sides of the organic layer. A hole is injected from the anode, an electron is injected from the cathode, and the hole and the electron are transported in the organic layer and encounter to form an exciton; under action of an electric field, the exciton causes radiation transition in an organic light-emitting molecule, resulting in a luminescence phenomenon. The OLED, as compared with an LCD, has advantages such as lightness and thinness, wide viewing angle, short response time and high luminous efficiency.

Integration of a touch function into a display device is a trend of a present state of the art. However, in the prior art, there is not a display device capable of integrating a touch technology and an OLED display technology.

SUMMARY

Embodiments of the present disclosure provide an OLED display substrate, a driving method thereof, and an OLED display device, which integrate a touch technology and an OLED display technology.

Embodiments of the present disclosure provide an OLED display substrate, comprising a base substrate and a first electrode layer, a light-emitting layer and a second electrode layer disposed on the base substrate, the light-emitting layer being disposed between the first electrode layer and the second electrode layer, wherein, the first electrode layer comprises driving electrodes and sensing electrodes corresponding to the driving electrodes, and mutual capacitance is formed between the driving electrodes and the sensing electrodes.

In one embodiment of the present disclosure, for example, the driving electrodes and the sensing electrodes are arranged alternately in a row direction of the base substrate, a plurality of the driving electrodes are formed in a column where each driving electrode is located in a column direction of the base substrate, driving electrodes in each column correspond to sensing electrodes in an adjacent column, and driving electrodes in each row in the row direction of the base substrate are electrically connected with each other.

In one embodiment of the present disclosure, for example, only one sensing electrode is formed in a column in the column direction of the base substrate.

In one embodiment of the present disclosure, for example, the second electrode layer comprises a plurality of second electrodes, and the light-emitting layer comprises a plurality of light-emitting structures, each light-emitting structure corresponds to one second electrode, and each second electrode and the light-emitting structure corresponding to the second electrode as well as a structure in the first electrode layer corresponding to the light-emitting structure form one OLED light-emitting device.

In one embodiment of the present disclosure, for example, the OLED display substrate further comprising: a driving circuit located on the base substrate; the driving circuit is configured for resetting in a reset stage and loading driving signals on the driving electrodes, so that the sensing electrodes sense sensing signals upon occurrence of touch according to the driving signals; the driving circuit is configured for respectively loading a reference voltage on the driving electrodes and the sensing electrodes corresponding to the driving electrodes in a display stage so that the OLED light-emitting device corresponding to the driving electrodes displays a picture.

In one embodiment of the present disclosure, for example, the driving circuit comprises a first switch transistor, a second switch transistor, a third switch transistor, a fourth switch transistor, a fifth switch transistor, a sixth switch transistor and a storage capacitor; a gate electrode of the first switch transistor is connected with a reset signal line, a first electrode of the first switch transistor is connected with a first node, and a second electrode of the first switch transistor is connected with a reset power supply; a gate electrode of the second switch transistor is connected with a first control line, a first electrode of the second switch transistor is connected with the first node, and a second electrode of the second switch transistor is connected with a second node; a gate electrode of the third switch transistor is connected with the first node, a first electrode of the third switch transistor is connected with a first power supply, and a second electrode of the third switch transistor is connected with the second node; a gate electrode of the fourth switch transistor is connected with the first control line, a first electrode of the fourth switch transistor is connected with a third node, and a second electrode of the fourth switch transistor is connected with a data line; a gate electrode of the fifth switch transistor is connected with a second control line, a first electrode of the fifth switch transistor is connected with the first power supply, and a second electrode of the fifth switch transistor is connected with the third node; a gate electrode of the sixth switch transistor is connected with a third control line, a first electrode of the sixth switch transistor is connected with the second node, and a second electrode of the sixth switch transistor is connected with a second electrode of the OLED light-emitting device; a first end of the storage capacitor is connected with the third node, and a second end of the storage capacitor is connected with the first node; the first electrode of the OLED light-emitting device is connected with a second power supply.

In one embodiment of the present disclosure, for example, each of the driving electrodes may correspond to one or more rows of OLED light-emitting devices.

In one embodiment of the present disclosure, for example, each OLED light-emitting device may correspond to one driving circuit.

In one embodiment of the present disclosure, for example, the sensing electrode loads a fixed voltage during the reset stage.

In one embodiment of the present disclosure, for example, the first electrode layer comprises a cathode electrode, and the second electrode layer comprises an anode electrode.

Embodiments of the present disclosure provide an OLED display device, comprising the above described OLED display substrate.

Embodiments of the present disclosure provide a driving method of the OLED display substrate according to claim 1, comprising: loading driving signals on the driving electrodes in a reset stage, so that the sensing electrodes corresponding to the driving electrodes senses a sensing signal upon occurrence of touch according to the driving signal; and respectively loading a reference voltage on the driving electrodes and the sensing electrodes corresponding to the driving electrodes in a display stage to display a picture.

In one embodiment of the present disclosure, for example, in the above described method, the second electrode layer comprises a plurality of second electrodes, and the light-emitting layer includes a plurality of light-emitting structures, each light-emitting structure corresponds to one of the second electrodes, and each second electrode and the light-emitting structure corresponding to the second electrode as well as a structure in the first electrode layer corresponding to the light-emitting structure form one OLED light-emitting device.

In one embodiment of the present disclosure, for example, in the above described method, the OLED display substrate further comprises: a driving circuit located on the base substrate; in the reset stage, the driving circuit resets and loads driving signals on the driving electrodes, so that the sensing electrodes corresponding to the driving electrodes senses a sensing signal upon occurrence of touch according to the driving signals; in the display stage, the driving circuit respectively loads a reference voltage on the driving electrodes and the sensing electrodes corresponding to the driving electrodes so that the OLED light-emitting device corresponding to the driving electrodes displays a picture.

In one embodiment of the present disclosure, for example, in the above described method, when one row of driving electrodes enter the display stage, a next row of driving electrodes enter the reset stage.

In the technical solution of the OLED display substrate provided by the present disclosure, the first electrode layer includes the driving electrodes and the corresponding sensing electrodes, and mutual capacitance is formed between the driving electrodes and the corresponding sensing electrodes, so as to integrate a touch technology and an OLED display technology.

DETAILED DESCRIPTION

In order to make technical solutions of the present disclosure fully understandable to a skilled person, the technical solutions of the embodiment will be described in a clearly and fully understandable way in connection with the drawings related to the embodiments of the disclosure.

Figure 1:
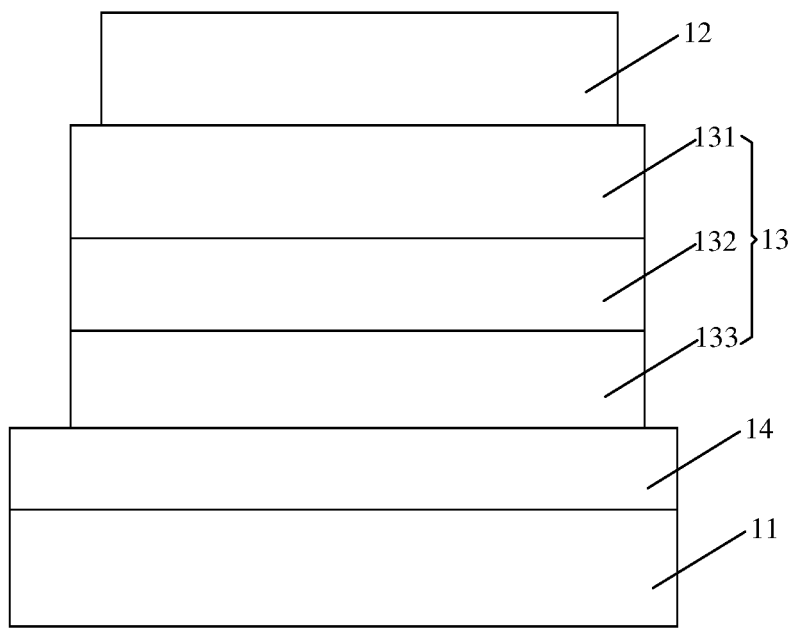
FIG. 1 is a structural schematic diagram of an OLED display substrate according to an embodiment of the present disclosure.
Figure 2:
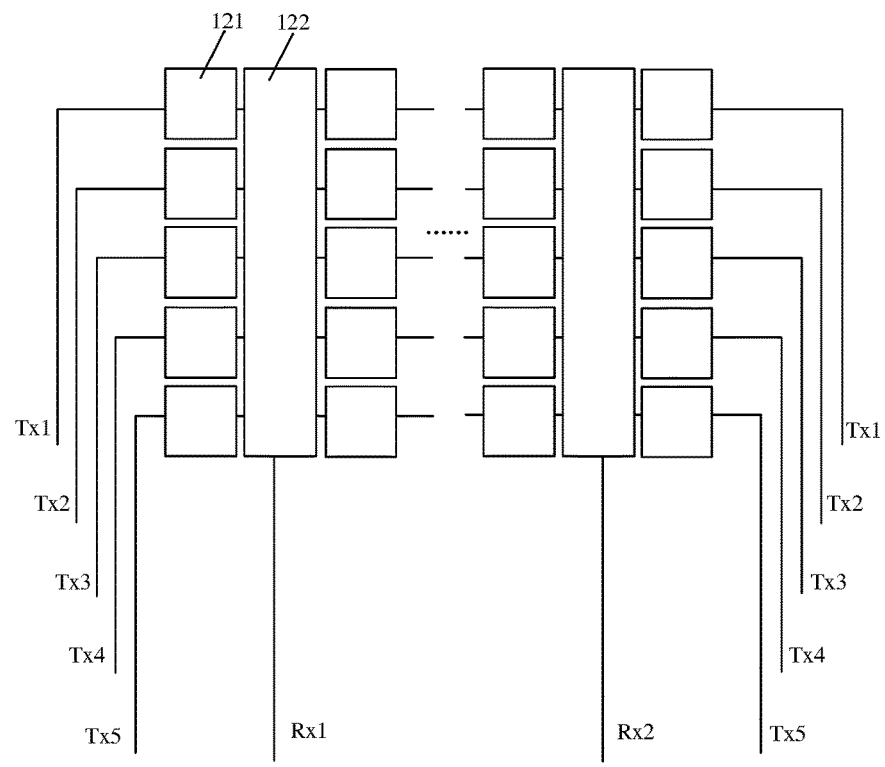
FIG. 2 is a structural schematic diagram of a first electrode layer in FIG. 1.

FIG. 1 is a structural schematic diagram of an OLED display substrate according to an embodiment of the present disclosure, and FIG. 2 is a structural schematic diagram of a first electrode layer 12 in FIG. 1. As shown in FIG. 1 and FIG. 2, the OLED display substrate comprises: a base substrate 11 and a first electrode layer 12, a light-emitting layer 13 and a second electrode layer 14 disposed on the base substrate 11, the light-emitting layer 13 being disposed between the first electrode layer 12 and the second electrode layer 14. In this embodiment, the second electrode layer 14, the light-emitting layer 13 and the first electrode layer 11 are sequentially located on the base substrate 11 in a direction away from the base substrate 11. The first electrode layer 12 comprises driving electrodes 121 and sensing electrodes 122, and mutual capacitance is formed between the driving electrodes 121 and the sensing electrodes 122.

In this embodiment, the light-emitting layer 13 comprises: an Electron Transport Layer (ETL) 131, an Emitting Material Layer (EML) 132 and a Hole Transport Layer (HTL) 133, and the Emitting Material Layer 132 is located between the Electron Transport Layer 131 and the Hole Transport Layer 133.

In this embodiment, the first electrode layer 12 comprises a cathode electrode, and the second electrode layer 14 comprises an anode electrode, or vice versa. Accordingly, the Electron Transport Layer 131 is located between the first electrode layer 12 and the Emitting Material Layer 132, and the Hole Transport Layer 133 is located between the second electrode layer 14 and the Emitting Material Layer 132.

The driving electrodes 121 and the sensing electrodes 122 in the first electrode layer 12 may be arranged in a row-and-column arrangement mode. As shown in FIG. 2, for example, the driving electrodes 121 and the sensing electrodes 122 are arranged alternately in a row direction of the base substrate, a plurality of driving electrodes 121 are formed in a column in a column direction of the base substrate, driving electrodes 121 in each column correspond to sensing electrodes 122 in an adjacent column, and the driving electrodes 121 in a same row in the row direction of the base substrate are electrically connected with each other. FIG. 2 only shows 5 rows and 4 columns of driving electrodes 121 and 2 columns of sensing electrodes 122. Driving electrodes 121 in Row 1 to driving electrodes 121 in Row 5 are respectively labeled as Tx1, Tx2, Tx3, Tx4, Tx5, wherein, each row of driving electrodes 121 includes 4 driving electrodes 121, and the 4 driving electrodes 121 have a same name, for example, the 4 driving electrodes 121 among the driving electrodes 121 in Row 1 all have a name of Tx1, and so on. Sensing electrodes 122 in Column 1 are Rx1, sensing electrodes 122 in the last column are Rx2, the sensing electrodes 122 in Column 1 are located between driving electrodes 121 in Column 1 and driving electrodes 121 in Column 2, and the sensing electrodes 122 in the last column are located between driving electrodes 121 in the last column and driving electrodes 121 in the next to last column.

For example, only one sensing electrode 122 may be formed in a column in the column direction of the base substrate. In other words, each column has only one sensing electrode 122.

The second electrode layer 14 includes a plurality of second electrodes, and the light-emitting layer 13 includes a plurality of light-emitting structures, each light-emitting structure includes an Electron Transport Layer 131, an Emitting Material Layer 132, and a Hole Transport Layer 133, and each light-emitting structure corresponds to one second electrode, and each second electrode and the corresponding light-emitting structure as well as a structure in the first electrode layer 12 corresponding to the light-emitting structure form one OLED light-emitting device.

Figure 3:
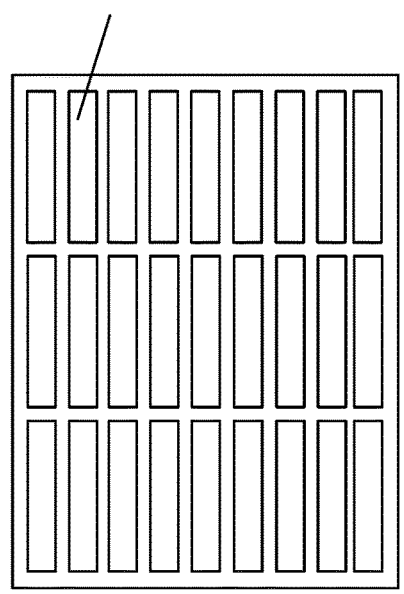
FIG. 3 is a schematic diagram of a plurality of OLED light-emitting devices corresponding to one driving electrode in FIG. 2.

Each driving electrode 121 may correspond to one or more OLED light-emitting devices. In this embodiment, each driving electrode 121 corresponds to a plurality of OLED light-emitting devices, and FIG. 3 is a schematic diagram of a plurality of OLED light-emitting devices corresponding to one driving electrode 121 in FIG. 2. As shown in FIG. 3, each driving electrode 121 corresponds to 3 rows and 9 columns of OLED light-emitting devices.

The OLED display substrate further comprises: a driving circuit located on the base substrate 11. The driving circuit is configured for resetting in a reset stage and loading driving signals on the driving electrodes 121, so that the sensing electrodes 122 corresponding to the driving electrodes 121 senses a sensing signal upon occurrence of touch according to the driving signals. The driving circuit is also used for respectively loading a reference voltage on the driving electrodes 121 and the corresponding sensing electrodes 122 in a display stage so that the OLED light-emitting device corresponding to the driving electrode 121 displays a picture.

Figure 4:
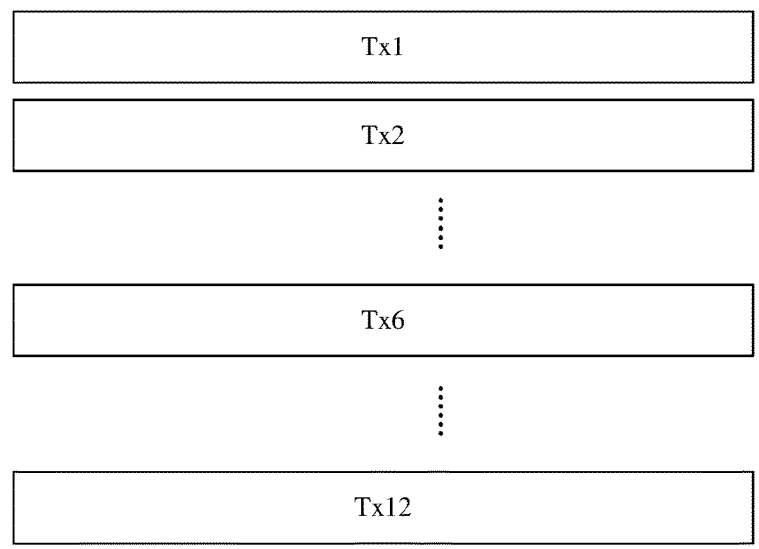
FIG. 4 is a schematic diagram of a driving electrode according to an embodiment of the present disclosure.

FIG. 4 is a schematic diagram of a driving electrode according to an embodiment of the present disclosure. As shown in FIG. 4, in this embodiment, the entire OLED display substrate comprises 12 rows of driving electrodes, and driving electrodes in Row 1 to driving electrodes in Row 12 are labeled by Tx1, Tx2, . . . , Tx11, Tx12, respectively. In practical application, other number of rows of driving electrodes may further be set according to needs of the product.

Hereinafter, the driving circuit and its driving process will be described in detail through a specific example.

Figure 5:
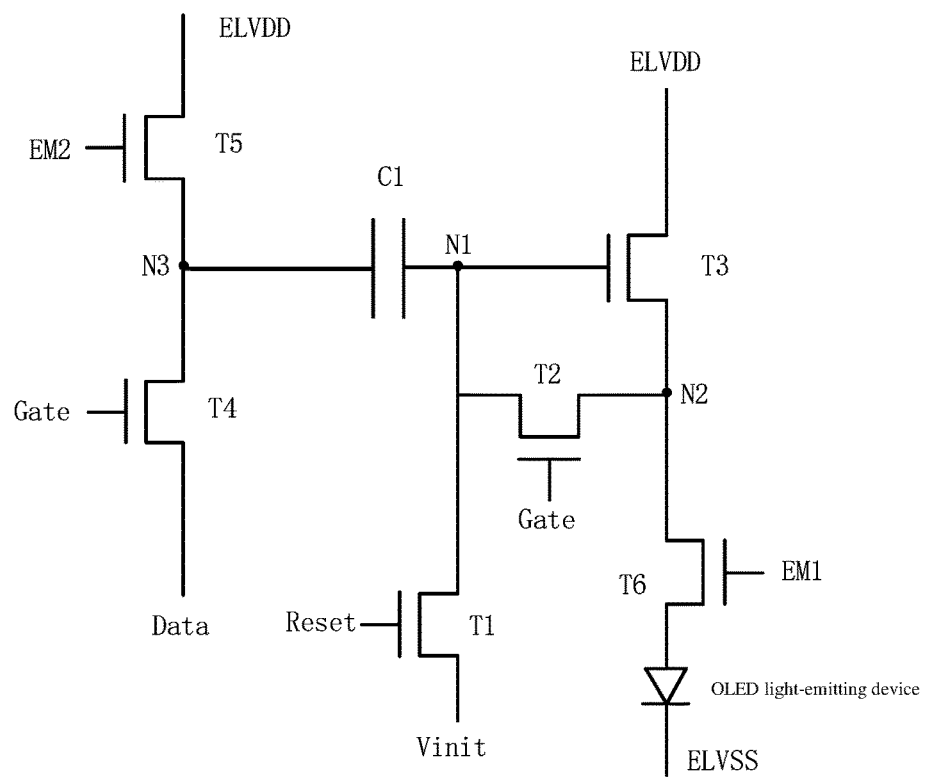
FIG. 5 is a circuit schematic diagram of a driving circuit according to an embodiment of the present disclosure.

FIG. 5 is a circuit schematic diagram of a driving circuit according to an embodiment of the present disclosure. As shown in FIG. 5, the driving circuit includes a first switch transistor T1, a second switch transistor T2, a third switch transistor T3, a fourth switch transistor T4, a fifth switch transistor T5, a sixth switch transistor T6 and a storage capacitor C1. A second electrode of the OLED light-emitting device is connected with a second electrode of the sixth switch transistor T6, and the first electrode layer of the OLED light-emitting device is connected with a second power supply. In this embodiment, the first electrode layer includes a cathode, and the second electrode layer includes an anode. An anode of the OLED light-emitting device is connected with the second electrode of the sixth switch transistor T6, and a cathode of the OLED light-emitting device is connected with the second power supply.

For example, a gate electrode of the first switch transistor "T1" is connected with a reset signal line "Reset", a first electrode of the first switch transistor "T1" is connected with a first node "N1", and a second electrode of the first switch transistor "T1" is connected with a reset power supply "Vinit". A gate electrode of the second switch transistor "T2" is connected with a first control line "Gate", a first electrode of the second switch transistor "T2" is connected with the first node "N1", and a second electrode of the second switch transistor "T2" is connected with a second node "N2". A gate electrode of the third switch transistor "T3" is connected with the first node "N1", a first electrode of the third switch transistor "T3" is connected with a first power supply "ELVDD", and a second electrode of the third switch transistor "T3" is connected with the second node "N2". A gate electrode of the fourth switch transistor "T4" is connected with the first control line "Gate", a first electrode of the fourth switch transistor "T4" is connected with a third node "N3", and a second electrode of the fourth switch transistor "T4" is connected with a data line "Data". A gate electrode of the fifth switch transistor "T5" is connected with a second control line "EM2", a first electrode of the fifth switch transistor "T5" is connected with the first power supply "ELVDD", and a second electrode of the fifth switch transistor "T5" is connected with the third node "N3". A gate electrode of the sixth switch transistor "T6" is connected with a third control line "EM1", a first electrode of the sixth switch transistor "T6" is connected with the second node "N2", and a second electrode of the sixth switch transistor "T6" is connected with an anode of the OLED light-emitting device. A first end of the storage capacitor "C1" is connected with the third node "N3", and a second end of the storage capacitor "C1" is connected with the first node "N1". A cathode of the OLED light-emitting device is connected with a second power supply "ELVSS".

Figure 6:
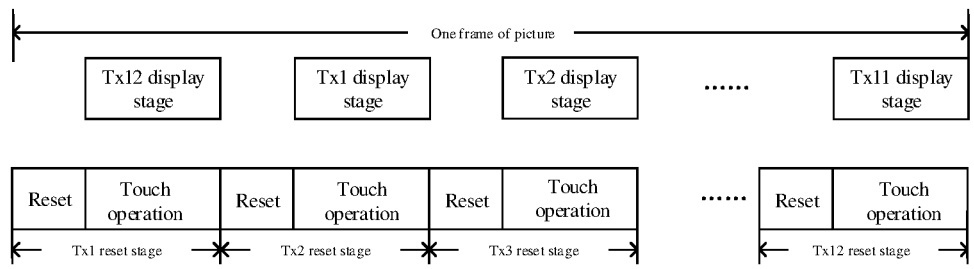
FIG. 6 is a schematic diagram showing a frame of picture by a driving circuit of the driving electrode in FIG. 4.
Figure 7:
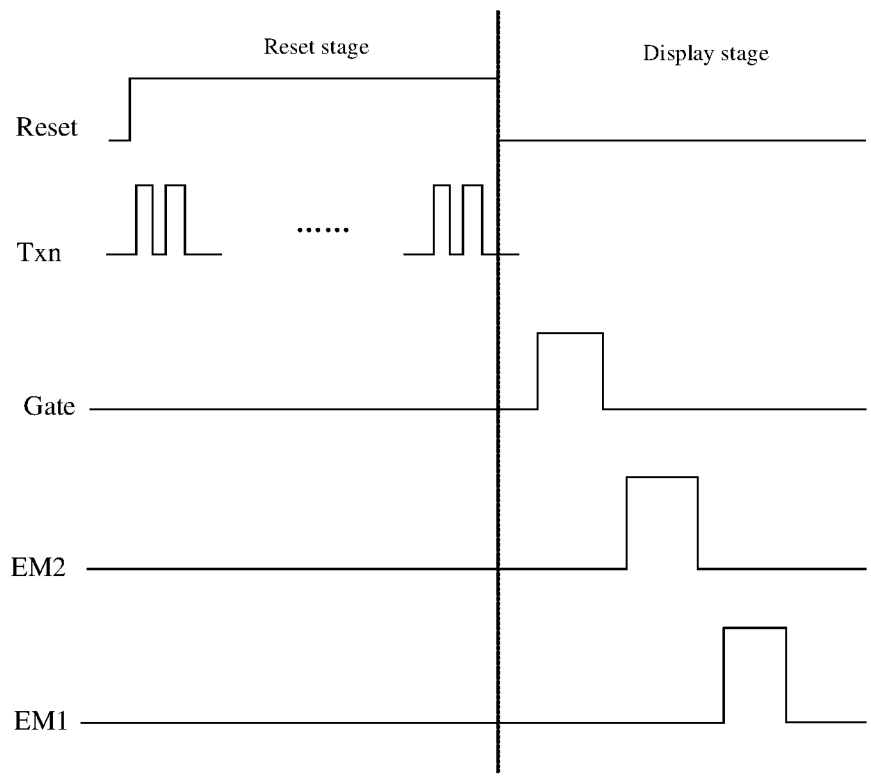
FIG. 7 is a timing diagram of the driving circuit in FIG. 5.

FIG. 6 is a schematic diagram showing a frame of a picture by a driving circuit of the driving electrodes in FIG. 4, and FIG. 7 is a timing diagram of the driving circuit in FIG. 5. As shown in FIG. 5, FIG. 6 and FIG. 7, with the driving electrodes Tx1 in Row 1 as an example, the driving electrodes Tx1 in Row 1 correspond to a plurality of rows of OLED light-emitting devices, each row of OLED light-emitting devices may include a plurality of OLED light-emitting devices, and each OLED light-emitting device corresponds to a driving circuit.

The plurality of rows of OLED light-emitting devices corresponding to the driving electrodes Tx1 in Row 1 enter the reset stage firstly. In the reset stage, the reset signal line "Reset" outputs a first control signal to the gate electrode of the first switch transistor "T1" so that the first switch transistor "T1" is turned on, and the first control signal may be at a high level; the first control line "Gate" outputs a second control signal to the gate electrode of the second switch transistor "T2" and the gate electrode of the fourth switch transistor "T4" so that the second switch transistor "T2" and the fourth switch transistor "T4" are turned off, and the second control signal may be at a low level; the second control line "EM2" outputs a third control signal to the gate electrode of the fifth switch transistor "T5" so that the fifth switch transistor "T5" is turned off, and the third control signal may be at a low level; the third control line "EM1" outputs a fourth control signal to the gate electrode of the sixth switch transistor "T6" so that the sixth switch transistor "T6" is turned off, and the fourth control signal may be at a low level. At this time, the reset power supply "Vinit" outputs a reset signal to the first node "N1" through the first switch transistor "T1" which is turned on so that a voltage of the gate electrode of the third switch transistor "T3" is reset to 0V, and so that the third switch transistor "T3" is turned off. Then, driving signals are loaded on the driving electrodes "Tx1" in Row 1, so that the corresponding sensing electrode senses a sensing signal upon occurrence of touch according to the driving signal. For example, the driving signal is a square wave signal. For example, the sensing electrode loads a fixed voltage during the reset stage. Since the third switch transistor "T3" is turned off during the entire reset stage, the OLED light-emitting devices corresponding to the driving electrodes "Tx1" in Row 1 display black, so as not to be affected by the driving signal loaded on the driving electrodes "Tx1" in Row 1 to display an uncertain flicker.

The plurality of rows of OLED light-emitting devices corresponding to the driving electrodes "Tx1" in Row 1 enter a display stage after completion of the reset stage. In this embodiment, the display stage may include a charging stage, a compensation stage, and a light emission stage. The respective rows of OLED light-emitting devices corresponding to the driving electrodes "Tx1" in Row 1 sequentially enter the display stage.

In the charging stage, the reset signal line "Reset" outputs the first control signal to the gate electrode of the first switch transistor "T1" so that the first switch transistor "T1" is turned off, and the first control signal may be at a low level; the first control line "Gate" outputs the second control signal to the gate electrode of the second switch transistor "T2" and the gate electrode of the fourth switch transistor "T4" so that the second switch transistor "T2" and the fourth switch transistor "T4" are turned on, and the second control signal may be at a high level; the second control line "EM2" outputs the third control signal to the gate electrode of the fifth switch transistor "T5" so that the fifth switch transistor "T5" is turned off, and the third control signal may be at a low level; the third control line "EM1" outputs the fourth control signal to the gate electrode of the sixth switch transistor "T6" so that the sixth switch transistor "T6" is turned off, and the fourth control signal may be at a low level. At this time, the data line "Data" outputs a data voltage "Vdata" to the first end of the storage capacitor "C1" (i.e., the third node "N3") through the fourth switch transistor "T4" which is turned on, a voltage of the second end of the storage capacitor "C1" (i.e., the first node "N1") is boosted from the first end to "Vdata" to turn on the third switch transistor "T3", the first power supply "ELVDD" outputs a first power supply voltage "Vdd" to the second end of the storage capacitor "C1" (i.e., the first node "N1") through the third switch transistor "T3" and the second switch transistor "T2" which are turned on; since the first power supply voltage "Vdd" passes through the third switch transistor "T3", a voltage of the first node "N1" is "Vdd"–"Vth", where, "Vth" is a threshold voltage of the third switch transistor "T3".

In the compensation stage, the reset signal line "Reset" outputs the first control signal to the gate electrode of the first switch transistor "T1" so that the first switch transistor "T1" is turned off, and the first control signal may be at a low level; the first control line "Gate" outputs the second control signal to the gate electrode of the second switch transistor "T2" and the gate electrode of the fourth switch transistor "T4" so that the second switch transistor "T2" and the fourth switch transistor "T4" are turned off, and the second control signal may be at a low level; the second control line "EM2" outputs the third control signal to the gate electrode of the fifth switch transistor "T5" so that the fifth switch transistor "T5" is turned on, and the third control signal may be at a high level; the third control line "EM1" outputs the fourth control signal to the gate electrode of the sixth switch transistor "T6" so that the sixth switch transistor "T6" is turned off, and the fourth control signal may be at a low level. At this time, the first power supply "ELVDD" outputs the first power supply voltage "Vdd" to the first end of the storage capacitor "C1" (i.e., the third node "N3") through the fifth switch transistor "T5" which is turned on, and the voltage of the first end of the storage capacitor "C1" (i.e., the third node "N3") abruptly changes to "Vdd"; since a voltage difference between the two ends of the storage capacitor "C1" remains unchanged, the voltage of the second end of the storage capacitor "C1" (i.e., the first node "N1") abruptly changes to 2Vdd–Vdata–Vth.

In the light emission stage, the reset signal line "Reset" outputs the first control signal to the gate electrode of the first switch transistor "T1" so that the first switch transistor "T1" is turned off, and the first control signal may be at a low level; the first control line "Gate" outputs the second control signal to the gate electrode of the second switch transistor "T2" and the gate electrode of the fourth switch transistor "T4" so that the second switch transistor "T2" and the fourth switch transistor "T4" are turned off, and the second control signal may be at a low level; the second control line "EM2" outputs the third control signal to the gate electrode of the fifth switch transistor "T5" so that the fifth switch transistor "T5" is turned off, and the third control signal may be at a low level; the third control line "EM1" outputs the fourth control signal to the gate electrode of the sixth switch transistor "T6" so that the sixth switch transistor "T6" is turned on, and the fourth control signal may be at a high level. Since the voltage of the second end (i.e., the first node "N1") of the storage capacitor "C1" is 2Vdd–Vdata–Vth, the third switch transistor "T3" is turned on. Also, since the sixth switch transistor "T6" is turned on, the OLED light-emitting device emits light. At this time, a current flowing through the OLED light-emitting device is:

$$I_{oled} = \tfrac{1}{2} K (V_{GS} - V_{th})^2 = \tfrac{1}{2} K [V_{dd} - (2V_{dd} - V_{data} - V_{th}) - V_{th}]^2 = \tfrac{1}{2} K [V_{dd} + V_{data}]^2,$$

Where, "K" is a process parameter, and "$V_{GS}$" is a gate-source voltage of the third switch transistor "T3". In the above-described formula, the threshold voltage "Vth" of the switch transistor is eliminated, and thus the current flowing through the OLED light-emitting device is not affected by the threshold voltage "Vth" of the switch transistor, so that light emission of the OLED light-emitting device is stabilized.

In the charging stage, the compensation stage and the light emission stage as described above, the second power supply "ELVSS" loads a reference voltage "Vss" on the cathodes (i.e., the driving electrodes and the sensing electrodes corresponding to each other) of the OLED light-emitting devices in Row 1 corresponding to the driving electrodes "Tx1" in Row 1, to display a picture.

The above charging, compensation and light emission processes are repeatedly performed such that the respective rows of the OLED light-emitting devices corresponding to the driving electrodes "Tx1" in Row 1 sequentially complete display, and then, the driving electrodes "Tx2" in Row 2 enter the reset stage to implement a touch operation, and then enter the display stage to display a picture, and so on.

For example, as shown in FIG. 6, when the respective rows of OLED light-emitting devices corresponding to the driving electrodes "Tx1" in Row 1 enter the reset stage, the respective rows of OLED light-emitting devices corresponding to the driving electrodes "Tx12" enter the display stage; and when the respective rows of OLED light-emitting devices corresponding to the driving electrodes "Tx2" enter the reset stage, the respective rows of OLED light-emitting devices corresponding to the driving electrodes "Tx1" enter the display stage, and so on. That is, when one frame of pictures is displayed, and one row of driving electrodes enter the display stage, a next row of driving electrodes following the row of driving electrodes enter the reset stage. By using the above-described solution, time may be better utilized in procedures of touch (occurring in the reset stage) and display (occurring in the display stage), which reduces impact of touch operation on picture display.

In the technical solution of the OLED display substrate provided by this embodiment, the first electrode layer includes the driving electrodes and the corresponding sensing electrodes, and the mutual capacitance is formed between the driving electrodes and the corresponding sensing electrodes, so as to integrate a touch technology and an OLED display technology. Touch operation is performed in the reset stage, and picture display is performed in the display stage, which reduces impact of touch operation on picture display. Further, since when one row of driving electrodes enter the display stage, a next row of driving electrodes enter the reset stage, it is not necessary to perform time-sharing operation on touch operation of the reset stage of the next row of driving electrodes and picture display of the display stage of the last row of driving electrodes, which implements simultaneously touch operation and picture display. In this embodiment, touch operation is performed in the reset stage, and there is no charging/discharging process during the performing procedure of touch operation, so as to eliminate impact of touch parasitic capacitance, and achieves an excellent touch effect.

An embodiment of the present disclosure further provides an OLED display device, the OLED display device comprising: an OLED display substrate, which may use the OLED display substrate according to the above-described embodiments.

In the technical solution of the OLED display device provided by this embodiment, the first electrode layer includes the driving electrodes and the corresponding sensing electrodes, and the mutual capacitance is formed between the driving electrodes and the corresponding sensing electrodes, so as to integrate a touch technology and an OLED display technology. Touch operation is performed in the reset stage, and picture display is performed in the display stage, which reduces impact of touch operation on picture display. Further, since when one row of driving electrodes enter the display stage, a next row of driving electrodes following the row of driving electrodes enter the reset stage, it is not necessary to perform time-sharing operation on touch operation of the reset stage of the next row of driving electrodes and picture display of the display stage of the last row of driving electrodes, which implements simultaneously performing touch operation and picture display. In this embodiment, touch operation is performed in the reset stage, and there is no charging/discharging process during the performing procedure of touch operation, so as to eliminate impact of touch parasitic capacitance, and achieves an excellent touch effect.

An embodiment of the present disclosure further provides a driving method of an OLED display substrate, the OLED display substrate comprising a base substrate and a first electrode layer, a light-emitting layer and a second electrode layer 14 disposed on the base substrate, the light-emitting layer being disposed between the first electrode layer and the second electrode layer. In this embodiment, the second electrode layer, the light-emitting layer and the first electrode layer are sequentially located on the base substrate in a direction away from the base substrate, the first electrode layer includes driving electrodes and corresponding sensing electrodes, and mutual capacitance is formed between the driving electrodes and the corresponding sensing electrodes, the method comprising: loading driving signals on the driving electrodes in a reset stage, so that the sensing electrodes corresponding to the driving electrodes sense a sensing signal upon occurrence of touch according to the driving signal; and respectively loading a reference voltage on the driving electrodes and the sensing electrodes corresponding to the driving electrodes in a display stage so as to display a picture.

For example, the second electrode layer includes a plurality of second electrodes, and the light-emitting layer includes a plurality of light-emitting structures, each light-emitting structure corresponds to one of the second electrodes, and each of the second electrodes and the corresponding light-emitting structure and a structure in the first electrode layer corresponding thereto form one OLED light-emitting device. The OLED display substrate further comprises: a driving circuit disposed on the base substrate. In the reset stage, the driving circuit resets and loads driving signals on the driving electrodes, so that the sensing electrodes corresponding to the driving electrodes sense a sensing signal upon occurrence of touch according to the driving signals. In the display stage, the driving circuit respectively loads a reference voltage on the driving electrodes and the corresponding sensing electrodes so that the OLED light-emitting device corresponding to the driving electrodes displays a picture.

For example, when one row of driving electrodes enter the display stage, a next row of driving electrodes enter the reset stage.

The driving method of the OLED display substrate provided by this embodiment can be used for driving the OLED display substrate according to the embodiment of the present disclosure, and therefore, the foregoing description may be referred to for specific description of the OLED display substrate, which will not be repeated herein.

In the technical solution of the driving method of the OLED display substrate provided by this embodiment, the first electrode layer includes the driving electrodes and the corresponding sensing electrodes, and the mutual capacitance is formed between the driving electrodes and the corresponding sensing electrodes, so as to integrate a touch technology and an OLED display technology. Touch operation is performed in the reset stage, and picture display is performed in the display stage, which reduces impact of touch operation on picture display. Further, since when one row of driving electrodes enter the display stage, a next row of driving electrodes enter the reset stage, it is not necessary to perform time-sharing operation on touch operation of the reset stage of the next row of driving electrodes and picture display of the display stage of the last row of driving electrodes, which implements simultaneously touch operation and picture display. In this embodiment, touch operation is performed in the reset stage, and there is no charging/discharging process during the performing procedure of touch operation, so as to eliminate impact of touch parasitic capacitance, and achieves an excellent touch effect.

It is understandable that the above described embodiments are just exemplary embodiments for explaining the principle of the present invention. The present invention are not limited by the above described embodiments. Based on the described embodiments herein, those skilled in the art can obtain other embodiment(s), without any inventive work, which should be within the scope of the disclosure.

The present application claims the priority of the Chinese Patent Application No. 201510608312.5 filed on Sep. 22, 2015, which is incorporated herein by reference as part of the disclosure of the present application.

What is claimed is:

1. An organic light-emitting diode (OLED) display substrate, comprising:
   a base substrate; and
   a first electrode layer, a light-emitting layer, and a second electrode layer disposed on the base substrate, the light-emitting layer being disposed between the first electrode layer and the second electrode layer, wherein the first electrode layer comprises driving electrodes and sensing electrodes corresponding to the driving electrodes, and wherein a mutual capacitance is formed between the driving electrodes and the sensing electrodes, wherein columns of the driving electrodes and columns of the sensing electrodes are arranged alternately in a row direction of the base substrate, each column of the driving electrodes comprises a plurality of the driving electrodes, wherein the plurality of the driving electrodes correspond to a sensing electrode in an adjacent column, and driving electrodes in each row in the row direction of the base substrate are electrically connected with each other, and each column of the sensing electrodes comprises only one sensing electrode.

2. The OLED display substrate according to claim 1, wherein the second electrode layer comprises a plurality of second electrodes, and the light-emitting layer comprises a plurality of light-emitting structures, each light-emitting structure corresponds to one second electrode, and each second electrode and the light-emitting structure corresponding to the second electrode, as well as a structure in the first electrode layer corresponding to the light-emitting structure, form one OLED light-emitting device.

3. The OLED display substrate according to claim 1, further comprising: a driving circuit located on the base substrate, wherein the driving circuit is configured for resetting in a reset stage and loading driving signals on the driving electrodes, so that the sensing electrodes sense sensing signals according to the driving signals upon occurrence of a touch; and wherein the driving circuit is configured for loading a reference voltage on the driving electrodes and the sensing electrodes corresponding to the driving electrodes in a display stage so that an OLED light-emitting device corresponding to the driving electrodes displays a picture.

4. The OLED display substrate according to claim 3, wherein, the driving circuit comprises a first switch transistor, a second switch transistor, a third switch transistor, a fourth switch transistor, a fifth switch transistor, a sixth switch transistor, and a storage capacitor;

a gate electrode of the first switch transistor is connected with a reset signal line, a first electrode of the first switch transistor is connected with a first node, and a second electrode of the first switch transistor is connected with a reset power supply;

a gate electrode of the second switch transistor is connected with a first control line, a first electrode of the second switch transistor is connected with the first node, and a second electrode of the second switch transistor is connected with a second node;

a gate electrode of the third switch transistor is connected with the first node, a first electrode of the third switch transistor is connected with a first power supply, and a second electrode of the third switch transistor is connected with the second node;

a gate electrode of the fourth switch transistor is connected with the first control line, a first electrode of the fourth switch transistor is connected with a third node, and a second electrode of the fourth switch transistor is connected with a data line;

a gate electrode of the fifth switch transistor is connected with a second control line, a first electrode of the fifth switch transistor is connected with the first power supply, and a second electrode of the fifth switch transistor is connected with the third node;

a gate electrode of the sixth switch transistor is connected with a third control line, a first electrode of the sixth switch transistor is connected with the second node, and a second electrode of the sixth switch transistor is connected with a second electrode of the OLED light-emitting device;

a first end of the storage capacitor is connected with the third node, and a second end of the storage capacitor is connected with the first node; and the first electrode of the OLED light-emitting device is connected with a second power supply.

5. The OLED display substrate according to claim 2, wherein, each of the driving electrodes corresponds to one or more rows of OLED light-emitting devices.

6. The OLED display substrate according to claim 3, wherein, each OLED light-emitting device corresponds to one driving circuit.

7. The OLED display substrate according to claim 3, wherein, the sensing electrodes load a fixed voltage during the reset stage.

8. The OLED display substrate according to claim 1, wherein, the first electrode layer comprises a cathode electrode, and the second electrode layer comprises an anode electrode.

9. An organic light-emitting diode (OLED) display device, comprising the OLED display substrate according to claim 1.

10. A driving method of the OLED display substrate according to claim 1, comprising:

loading driving signals on the driving electrodes in a reset stage, so that the sensing electrodes corresponding to the driving electrodes sense sensing signals according to the driving signals upon occurrence of a touch; and loading a reference voltage on the driving electrodes and the sensing electrodes corresponding to the driving electrodes in a display stage to display a picture.

11. The driving method of the OLED display substrate according to claim 10, wherein, the second electrode layer comprises a plurality of second electrodes, and the light-emitting layer includes a plurality of light-emitting structures, each light-emitting structure corresponds to one of the second electrodes, and each second electrode and the light-emitting structure corresponding to the second electrode, as well as a structure in the first electrode layer corresponding to the light-emitting structure, form one OLED light-emitting device.

12. The driving method of the OLED display substrate according to claim 10, wherein, the OLED display substrate further comprises: a driving circuit located on the base substrate;

in the reset stage, the driving circuit resets and loads the driving signals on the driving electrodes, so that the sensing electrodes corresponding to the driving electrodes sense the sensing signals according to the driving signals upon occurrence of touch; and in the display stage, the driving circuit loads the reference voltage on the driving electrodes and the sensing electrodes corresponding to the driving electrodes so that an OLED light-emitting device corresponding to the driving electrodes displays the picture.

13. The driving method of the OLED display substrate according to claim 12, wherein, upon one row of driving electrodes entering the display stage, a next row of driving electrodes enters the reset stage.

14. The OLED display substrate according to claim 2, wherein, the first electrode layer comprises a cathode electrode, and the second electrode layer comprises an anode electrode.

15. The OLED display substrate according to claim 3, wherein, the first electrode layer comprises a cathode electrode, and the second electrode layer comprises an anode electrode.

16. The OLED display substrate according to claim 4, wherein, the first electrode layer comprises a cathode electrode, and the second electrode layer comprises an anode electrode.

\* \* \* \* \*